United States Patent [19]
Ferla et al.

[11] Patent Number: 5,670,392
[45] Date of Patent: Sep. 23, 1997

[54] PROCESS FOR MANUFACTURING HIGH-DENSITY MOS-TECHNOLOGY POWER DEVICES

[75] Inventors: Giuseppe Ferla, Catania; Ferruccio Frisina, Sant'agata li Battiati, both of Italy

[73] Assignees: SGS-Thomson Microelectronics S.r.l., Agrate Brianza; Consorzio per la Ricerca Sulla Microettronica nel Mezzogiorno, Catania, both of Italy

[21] Appl. No.: 498,008

[22] Filed: Jun. 30, 1995

[30] Foreign Application Priority Data

Jul. 4, 1994 [EP] European Pat. Off. ............ 94830331

[51] Int. Cl.$^6$ .................................................. H01L 21/265
[52] U.S. Cl. .............................. 437/29; 437/40; 437/41; 437/35; 437/44; 148/DIG. 126
[58] Field of Search .................... 437/29, 40 DM, 437/41 DM, 35, 44; 148/DIG. 126

[56] References Cited

U.S. PATENT DOCUMENTS 3,461,360   8/1969   Barson et al. .................... 317/235

(List continued on next page.)

FOREIGN PATENT DOCUMENTS 0 255 970   2/1988   European Pat. Off. ........ H01L 21/28

(List continued on next page.)

OTHER PUBLICATIONS

IEEE Journal of Solid–State Circuits, vol. SC–11, No. 5, Oct. 1976, Michael D. Pocha, et al., "A Computer–Aided Design Model for High–Voltage Double Diffused MOS (DMOS) Transistors", pp. 718–726.

(List continued on next page.)

Primary Examiner—Charles L. Bowers, Jr.
Assistant Examiner—Lynne A. Gurley
Attorney, Agent, or Firm—Wolf, Greenfield & Sacks, P.C.; James H. Morris

[57] ABSTRACT

A process for manufacturing high-density MOS-technology power devices includes the steps of: forming a conductive insulated gate layer on a surface of a lightly doped semiconductor material layer of a first conductivity type; forming an insulating material layer over the insulated gate layer; selectively removing the insulating material layer and the underlying insulated gate layer to form a plurality of elongated windows having two elongated edges and two short edges, delimiting respective uncovered surface stripes of the semiconductor material layer; implanting a high dose of a first dopant of the first conductivity type along two directions which lie in a plane transversal to said elongated windows and orthogonal to the semiconductor material layer surface, and which are substantially symmetrically tilted at a first prescribed angle with respect to a direction orthogonal to the semiconductor material layer surface, the first angle depending on the overall thickness of the insulated gate layer and of the insulating material layer to prevent the first dopant from being implanted in a central stripe of the uncovered surface stripes, to form pairs of heavily doped elongated source regions of the first conductivity type which extend along the two elongated edges of each elongated window and which are separated by the central stripe; implanting a low dose of a second dopant of a second conductivity type along two directions which lie in the plane, and which are substantially symmetrically tilted of a second prescribed angle with respect to the orthogonal direction, to form doped regions of the second conductivity type each comprising two lightly doped elongated channel regions extending under the two elongated edges of each elongated window; implanting a high dose of a third dopant of the second conductivity type substantially along the orthogonal direction, the insulating material layer acting as a mask, to form heavily doped regions substantially aligned with the edges of the elongated windows.

24 Claims, 5 Drawing Sheets

U.S. PATENT DOCUMENTS

| | | | |
|---|---|---|---|
| 3,909,320 | 9/1975 | Gauge et al. | 148/187 |
| 4,001,860 | 1/1977 | Cauge et al. | 357/23 |
| 4,190,850 | 2/1980 | Tihanvi et al. | 357/23 |
| 4,417,385 | 11/1983 | Temple | 29/571 |
| 4,593,302 | 6/1986 | Lidow et al. | 357/23.4 |
| 4,680,853 | 7/1987 | Lidow et al. | 29/571 |
| 4,716,126 | 12/1987 | Cogan | 437/24 |
| 4,889,820 | 12/1989 | Mori | 437/29 |
| 4,931,408 | 6/1990 | Hshieh | 437/44 |
| 5,119,153 | 6/1992 | Korman et al. | 357/23.4 |
| 5,378,641 | 1/1995 | Cheffings | 437/35 |
| 5,426,063 | 6/1995 | Kaneko et al. | 437/35 |
| 5,459,085 | 10/1995 | Pasen et al. | 437/35 |

FOREIGN PATENT DOCUMENTS

| | | | |
|---|---|---|---|
| 51-85381 | 7/1976 | Japan | H01L 29/78 |
| 3241747 | 10/1991 | Japan | 437/35 |
| 4062849 | 2/1992 | Japan | 437/35 |

OTHER PUBLICATIONS

Proceedings of the 1st Conference on Solid State Devices, Tokyo 1969, Supplement to the Journal of The Japan Society of Applied Physics, vol. 39, 1970, Y. Tarui. et al., "Diffusion Self–Aligned MOST: A New Approch for High Speed Device"; pp. 105–110.

IEEE Journal of Solid–State Circuits, vol. SC–10, No. 5, Oct. 1975, T.J. Rodgers, et al., "An Experimental and Theoretical Analysis of Double–Diffused MOS Transistors"; pp. 322–331.

Microelechonik 4, Nov. 1970, Y. Tarui, et al., "Diffusion Self–ALigned MOST and Lateral Transistor"; pp. 102–129.

The Theory and Practice of Microelectronics, Chapters, 4,6,7,8,10,13 and 15; Ghandi.

Integrated Circuits Laboratory, Stanford Electronics Laboratories, Stanford University, Technical Report No. 4956–1, Mar. 1976, Michale D. Pocha, "High Voltage Double Diffused MOS Transistors for Integrated Circuits"; pp. 1–244.

Intel Corporation, Mountain View, University of California, Berkeley, John Wiley & Sons, A.S. Grove, "Physics and Technology of Semiconductor Devices".

Patent Abstracts of Japan, vol. 16, No. 275 (E–1219) Jun. 19, 1992 & JP–A–04 065 132 Oki Electric Ind. Co, Ltd.

Patent Abstracts of Japan, vol. 12, No. 330 (E–655) Sep. 7, 1988 & JP–A–63 095 669 Matsushita Electric Ind. Co.

PROCESS FOR MANUFACTURING HIGH-DENSITY MOS-TECHNOLOGY POWER DEVICES

BACKGROUND OF THE INVENTION

1. Field of the Invention

The present invention relates to a process for manufacturing high-density MOS-technology power devices, such as power MOSFETs and Insulated Gate Bipolar Transistors (IGBTs), and to a high-density MOS-technology power device integrated structure thus obtained.

2. Discussion of the Related Art

It is known that MOS-technology power devices are composed of a plurality of elementary functional units integrated in a semiconductor chip; each elementary functional unit forms an elementary vertical MOSFET which contributes a respective fraction to the overall power device current.

Conventionally, the elementary functional units are represented by polygonal-plan elementary cells, having a polygonal-plan P type region (called "body region"), formed in an N− semiconductor layer and comprising in turn a central P+ region (called "deep body region") and a lateral P− channel region; an N+ polygonal annular source region is formed inside the P type body region. The polygonal annular portion of the body region between the external edge of the N+ source region and the edge of the body region is covered by a conductive layer (polysilicon gate) superimposed on an insulating layer (gate oxide) and forms a channel region of the elementary MOSFET. The polysilicon layer is covered by a dielectric layer, in which a contact window is opened to allow a superimposed conductive layer (source electrode) to come into contact with the N+ source region and the portion of the body region delimited by the inner edge of the N+ source region; this is necessary to prevent a parasitic bipolar junction transistor (with emitter, base and collector represented by the source region, the deep body region and the N− semiconductor layer) from being triggered on.

A conventional manufacturing process substantially provides for:

epitaxially growing the N− semiconductor layer over a heavily doped substrate of the N conductivity type, in the case of a power MOSFET, or of the P conductivity type, in the case of an IGBT;

maskedly implanting and diffusing a heavy dose of a P type dopant into selected regions of the N type layer, to form the deep body regions of the elementary cells (first mask);

thermally growing a thin oxide layer over the surface of the N type layer;

depositing a polysilicon layer over the thin oxide layer;

selectively etching the polysilicon layer and the thin oxide layer around the deep body regions (second mask);

implanting a low dose of a P type dopant using the polysilicon and oxide layers as a mask;

diffusing the P type dopant to form channel regions extending under the thin oxide layer;

maskedly implanting a heavy dose of an N type dopant into the deep body and channel regions of the cells to form annular source regions (third mask);

depositing a dielectric layer over the polysilicon layer;

selectively etching the dielectric layer to open in it contact windows to the deep body regions and to the source regions (fourth mask);

depositing a metal layer over the dielectric layer.

The necessity of respecting the mask alignment rules in two directions (parallel to the sides of the elementary cells) severely limits the possibility of scaling down the dimensions of the cells, to increase the scale of integration.

In the co-pending European Patent Application No. 94830288.0 a MOS-technology power device is disclosed wherein the elementary functional units are represented by stripes much more elongated in a longitudinal direction ("the Y direction") on the surface of the N− semiconductor layer than in a transversal direction ("the X direction"); the source region comprises two regions elongated in the Y direction, and a plurality of transversal portions. In such a structure it is no longer necessary to respect the alignment rules of the contact mask with respect to the source mask along the X direction, since the transversal portions of the source region guarantee the short circuit between the source region and the deep body region even if the contact window opened in the dielectric layer has, in the X direction, the minimum dimension ("f") allowed by the optical resolution of the photolithographic apparatus employed.

In the above mentioned patent application, it is said that the minimum dimension Lsmin of the stripe in the X direction is given by:

Lsmin=f+2a where a is the minimum distance between the edge of the polysilicon layer and the edge of the contact window which, taking into account the alignment tolerance between the polysilicon mask and the contact mask, guarantees that the polysilicon gate is insulated from the source electrode.

Actually, another limit exists to the reduction of the dimension of the stripes along the X direction. The source mask is partially provided by the polysilicon and gate oxide layers, but further has a plurality of isles of photoresist over the middle portion of the stripes; this prevents the dimension of the stripes in the X direction from being below a value Lsmin' given by:

Lsmin'=Apmin+2s where Apmin is the minimum X dimension of the photoresist isles (minimum aperture in the dielectric layer) and coincide with the minimum dimension f allowed by the optical resolution of the photolithographic apparatus, and s is the minimum X dimension of each elongated portion of the source region, taking into account the alignment tolerance between the polysilicon mask and the source mask (i.e. between the edges of the polysilicon layer and the edges of the photoresist isles). By way of example, if for the source region a minimum dimension of 0.3 μm in the X direction must be guaranteed, and the mask alignment tolerance is +0.2 μm, s must be at least 0.5 μm, and this must be considered the minimum dimension during the source mask layout design.

If Lsmin<Lsmin', the actual limit to the reduction in the X dimension of the stripes is given by Lsmin'.

In view of the state of the art disclosed, it is an object of the present invention to provide a process for the manufacturing of MOS-technology power devices which allows obtaining higher scales of integration with respect to the abovementioned prior art.

SUMMARY OF THE INVENTION

According to the present invention, such object is attained by means of a process for manufacturing high-density MOS-technology power devices, including the steps of:

a) forming a conductive insulated gate layer on a surface of a lightly doped semiconductor material layer of a first conductivity type;

b) forming an insulating material layer over the insulated gate layer;

c) selectively removing the insulating material layer and the underlying insulated gate layer to form a plurality of elongated windows having two elongated edges and two short edges delimiting respective uncovered surface stripes of the semiconductor material layer;

d) implanting a high dose of a first dopant of the first conductivity type along two directions which lie in a plane transversal to said elongated windows and orthogonal to the semiconductor material layer surface, and which are substantially symmetrically tilted at a first prescribed angle with respect to a direction orthogonal to the semiconductor material layer surface, the first angle depending on the overall thickness of the insulated gate layer and of the insulating material layer to prevent the first dopant from being implanted in a central stripe of said uncovered surface stripes, to form pairs of heavily doped elongated source regions of the first conductivity type which extend along said two elongated edges of each elongated window and which are separated by said central stripe;

e) implanting a low dose of a second dopant of a second conductivity type along two directions which lie in said plane, and which are substantially symmetrically tilted at a second prescribed angle with respect to said orthogonal direction, to form doped regions of the second conductivity type each including two lightly doped elongated channel regions extending under the two elongated edges of each elongated window;

f) implanting a high dose of a third dopant of the second conductivity type substantially along said orthogonal direction, the insulating material layer acting as a mask, to form heavily doped regions substantially aligned with the edges of the elongated windows.

In the process according to the present invention, the implantation mask for the source regions coincides with the implantation mask for the channel regions and for the deep body regions of the elementary functional units; this is made possible by the use of implanting apparatus that allows the dopant to be implanted along directions tilted at angles ranging from 0° to 60° with respect to a direction orthogonal to the surface of the material wherein the dopant is to be implanted. Consequently, the tolerance on the dimension of the source regions is not determined by the mask alignment rules, but substantially by the tolerance of the thicknesses of three layers (gate oxide, polysilicon gate, insulating oxide), which is at least one order of magnitude lower. The dimension of the source region is therefore more finely controlled, and narrower elementary functional units can be formed.

Also according to the present invention, a high-density MOS-technology power device is provided including a plurality of elementary functional units formed in a semiconductor material layer of a first conductivity type covered by a conductive insulated gate layer sandwiched between two insulating layers, wherein each elementary functional unit comprises:

an elongated window formed in said insulated gate layer and in said two insulating layers, having two elongated edges and two short edges, said edges being sealed by insulating material sidewall spacers;

a heavily doped elongated deep body region of the second conductivity type formed in the semiconductor material layer and substantially aligned with the edges of the window;

two elongated channel regions of a second conductivity type formed in said semiconductor material layer and extending under the elongated edges of said window;

two elongated source regions of the first conductivity type formed in the deep body region along said elongated edges of the window.

BRIEF DESCRIPTION OF THE DRAWINGS

The features and advantages of the present invention will be made more evident by the following detailed description of a particular embodiment, illustrated as a non-limiting example in the annexed drawings, wherein.

DETAILED DESCRIPTION

Figure 1:
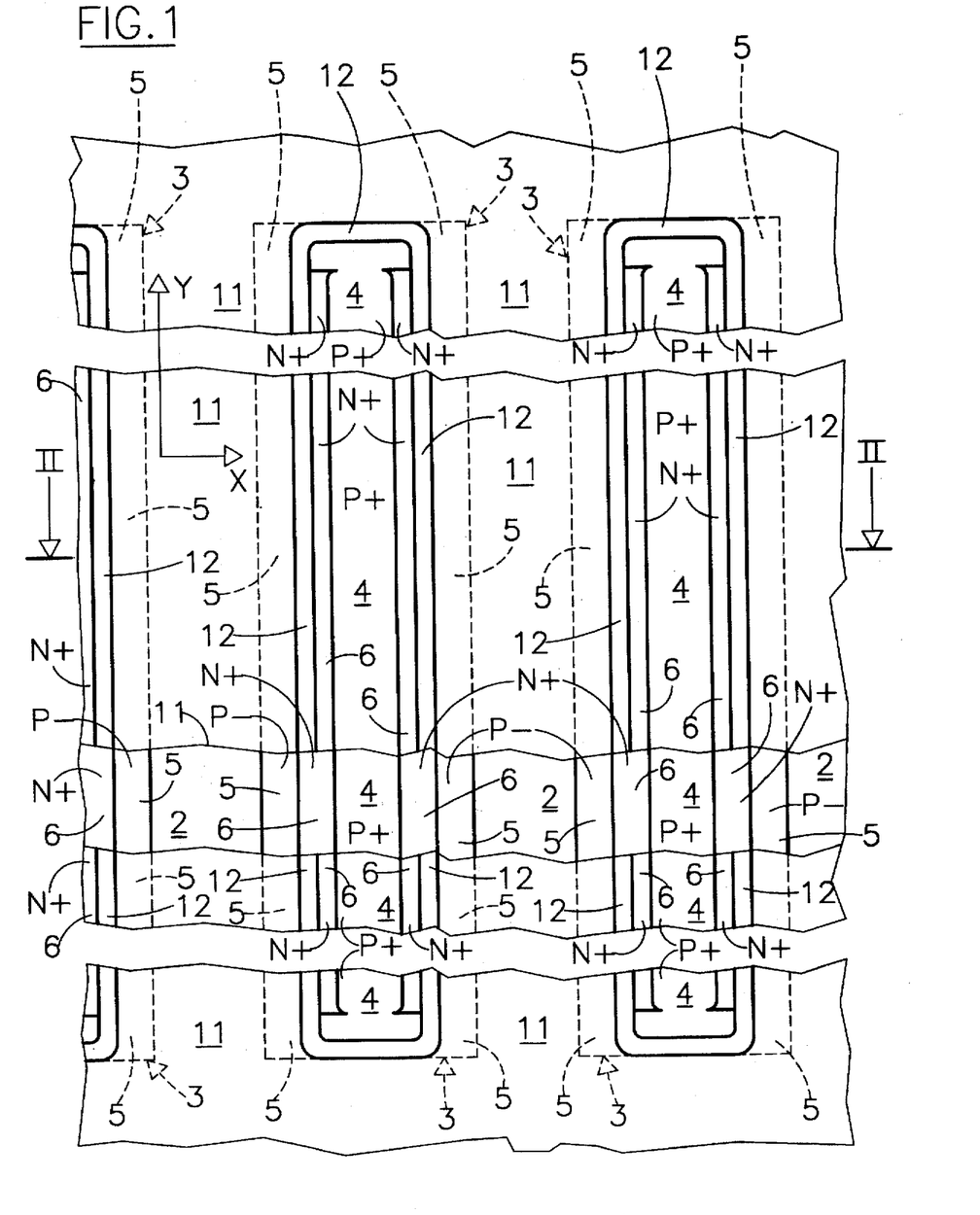
FIG. 1 is a top plan view of a portion of a MOS-technology power device according to the present invention.
Figure 2:
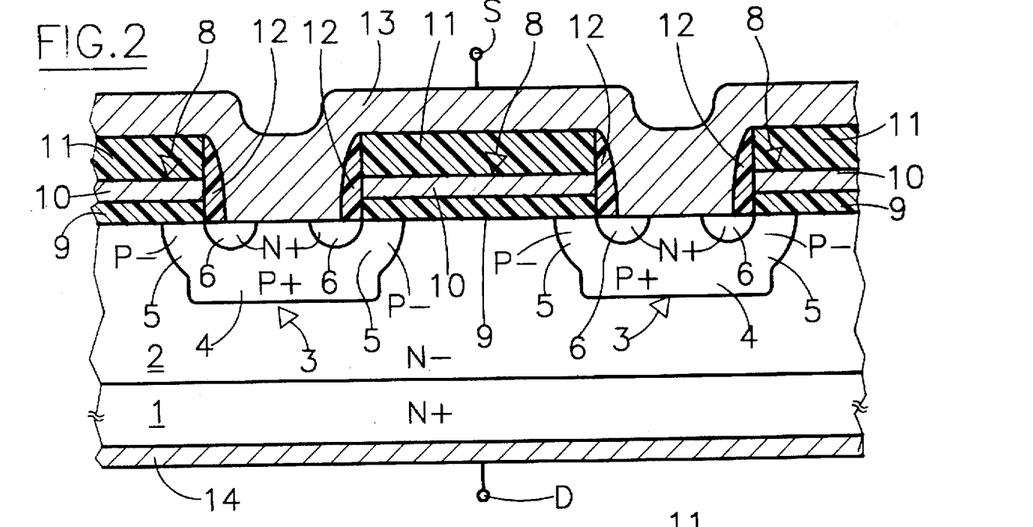
FIG. 2 is a cross-sectional view of the power device taken along the line II—II of FIG. 1.

As shown in FIGS. 1 and 2, respectively in top-plan and cross-sectional views, a high-density MOS-technology power device according to the present invention (a power MOSFET in this example) includes in a per-se known manner an N− semiconductor layer 2 superimposed on an N+ semiconductor substrate 1. The N− layer 2 forms a common drain region for the power MOSFET, and the N+ substrate 1 provides a low resistance contact to the N− layer 2. A metal layer 14 covers the bottom surface of the N+ substrate 1 and forms a drain electrode D of the power MOSFET.

P type elongated regions 3, substantially of rectangular shape, are formed in the N− layer 2; each of said P type regions 3 comprises a P+ deep body region 4 laterally surrounded by two P− body regions 5. All the P type regions 3 extend along a longitudinal direction (Y, in FIG. 1) on the top surface of the N− layer 2. The dimension of the P type regions 3 in the Y direction is much greater (at least two orders of magnitude) than their dimension in a transversal direction (X, in FIG. 1 ).

Two N+ source regions 6 are provided inside each P type region 3, substantially in the P+ deep body region 4; the N+ source regions 6 are also elongated in the Y direction, but do not extend for the whole length of the P type region 3, for the reasons which will be explained later on.

Selected portions of the surface of the N− layer 2 are covered by a conductive insulated gate layer 8 comprising an insulating layer 9 (typically a thin silicon dioxide film also called "gate oxide"), and a conductive layer 10 (typically a polysilicon layer); the polysilicon layer 10 forms a gate electrode of the power MOSFET.

The insulated gate layer 8 is covered by a further insulating layer 11, such as silicon dioxide; the insulated gate layer 8 and the insulating layer 11 extend over the P− body regions 5 to the edges of the N+ source regions 6. The edges of the insulated gate layer 8 and of the insulating layer 11 are substantially aligned with the external edges of the N+ source regions 6, and with the edge of the P+ deep body regions 4. The edges of the insulated gate layer 8 and of the insulating layer 11 are sealed by sidewall spacers 12 of insulating material (e.g. silicon dioxide), which partially overlap the N+ source regions 6.

A metal conductive layer 13 (typically aluminum) covers the insulating layer 11 and contacts all the N+ source regions 6 and the P+ deep body regions 4; such a conductive layer forms a source electrode S of the power MOSFET.

Each P type region 3 represents an elementary functional unit (an elementary vertical MOSFET in this example), which is connected in parallel with all the other units and contributes a given fraction to the overall power MOSFET current.

A manufacturing process according to the present invention starts from a N+ semiconductor substrate 1 having a dopant concentration of about $10^{19}$ atoms/cm$^3$.

An N− semiconductor layer 2 is epitaxially grown over the N+ substrate 1; the N− layer 2 has resistivity ranging from 0.5 Ohm×cm to 50 Ohm×cm, and thickness ranging from 3 μm to 50 μm, depending on the breakdown voltage desired for the power MOSFET.

A thick oxide layer (not shown in the drawings) is grown over the N− layer 2, to form the edge structure of the power device chip; such thick oxide is removed from the so-called "active area" of the power device, i.e. the portion of the chip wherein the elementary MOSFETs are to be integrated.

Figure 3:
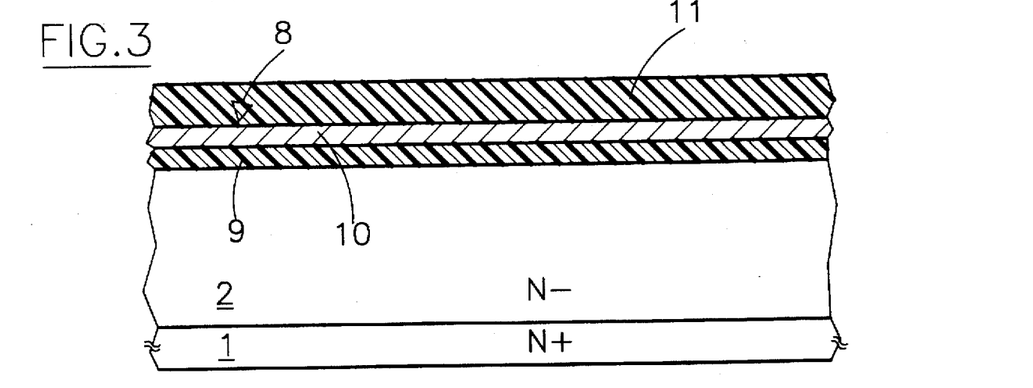
FIGS. 3 to 10 are cross-sectional views taken along the line II—II of FIG. 1, showing intermediate steps of a manufacturing process according to the invention.

An insulated gate layer 8 is then formed over the surface of the N− layer 2 in correspondence to the active area of the device; the insulated gate layer 8 comprises a thermally-grown thin oxide layer 9 and a polysilicon layer 10. A further thermal oxide layer 11 is formed over the polysilicon layer 10 (FIG. 3).

Figure 4:
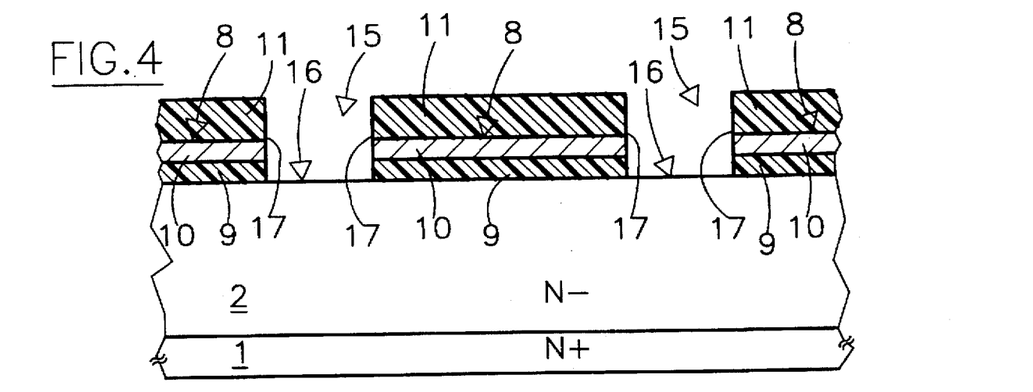
Figure 4A:
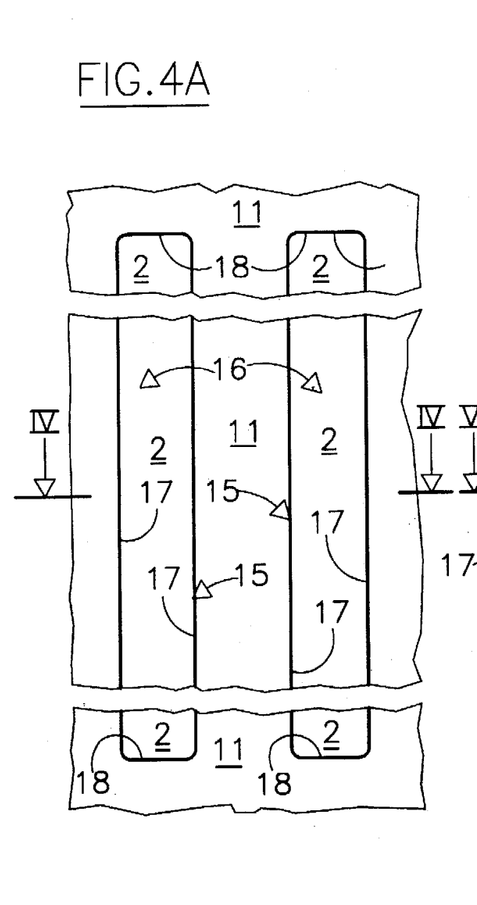
FIGS. 4A, 6A and 8A show top plan views of the power device just after the steps shown in FIGS. 4, 6 and 8, respectively.

The oxide layer 11 and the insulated gate layer 8 are then selectively removed to open windows 15 having substantially a rectangular shape with two elongated edges 17 along the Y direction, and two short edges 18 along the X direction; consequently, uncovered surface stripes 16 of the N− layer 2 are obtained (FIGS. 4 and 4A). This step is performed in a per-se known way by covering the oxide layer 11 with a photoresist (not shown), and removing it from the regions of the oxide layer 11 which are to be exposed to the action of an etchant with high selectivity towards silicon dioxide and polysilicon with respect to the photoresist material. The windows 15, and thus the uncovered surface stripes 16, are much more elongated in the Y direction than in the X direction (at least two orders of magnitude).

Figure 5:
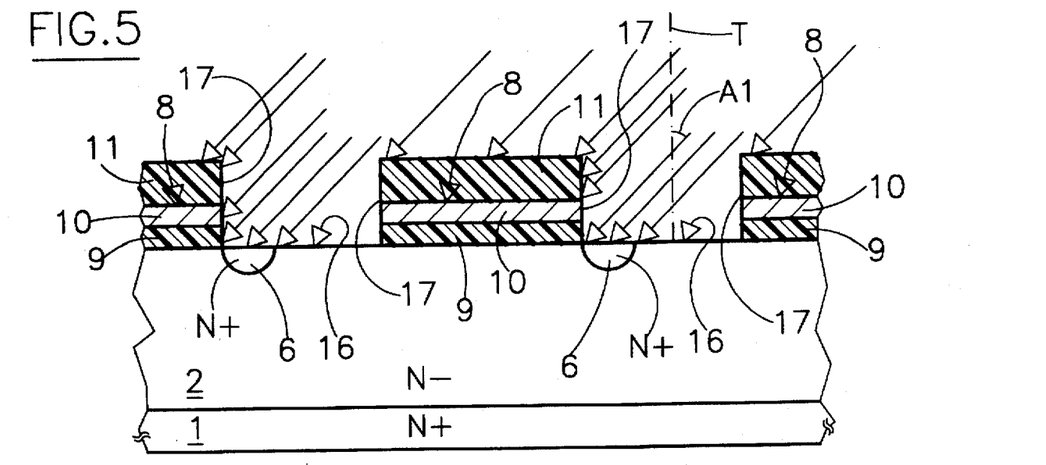

A high dose of an N type dopant is then selectively implanted into the N− layer 2, along a direction which lies in an orthogonal plane transversal to the stripes 16 (such as the plane of FIGS. 2–10), and which is tilted at an angle A1 with respect to a direction T orthogonal to the surface of the N− layer 2. The implant dose is in the range 1 to $6\times10^{15}$ cm$^2$ and the implant energy can vary from 50 to 100 KeV; the tilt angle A1 can have a value ranging from approximately 45° to 60°, depending on the overall thickness of the insulated gate layer 8 and the oxide layer 11, so that the oxide layer 11 and the insulated gate layer 8 act as an implantation mask to allow the dopant being implanted only in regions near one of the edges 17 of the windows 15, shielding the middle of the stripes 16. If for example the overall thickness of the layers 9, 10 and 11 is 0.5 μm, a tilt angle A1 of 60° allows forming, inside each uncovered surface stripe 16, an N+ stripe 6 of about 0.2–0.25 μm in the X direction and extending in the Y direction along said edge 17 of the windows 15 (FIG. 5).

Figure 6:
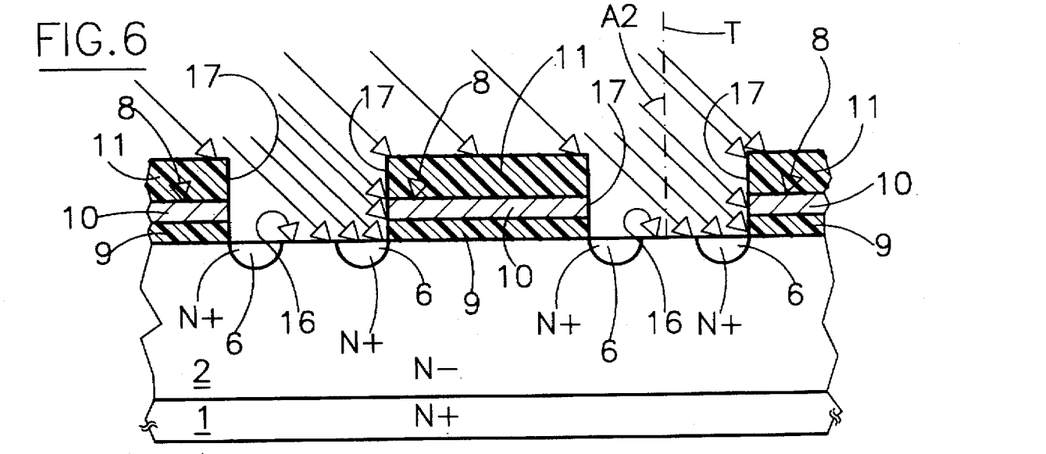
Figure 6A:
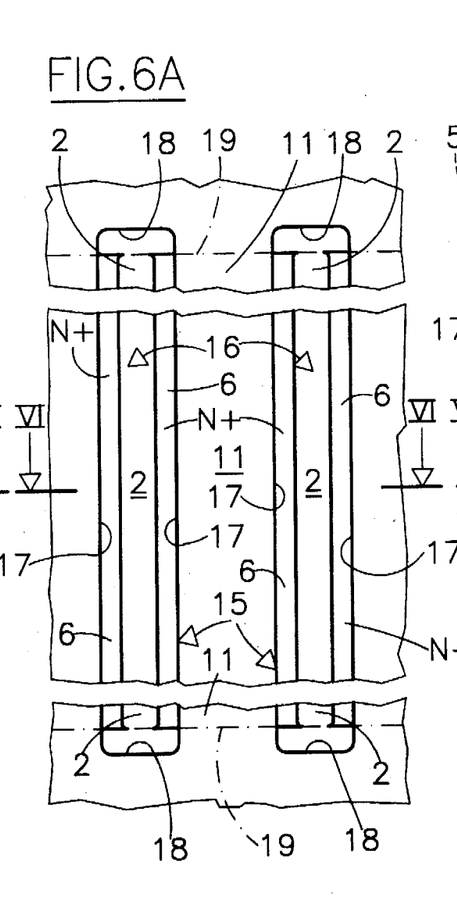

The previous step is repeated tilting the dopant ion beam at an angle A2, substantially symmetrical to A1, to form in a same manner another N+ stripe 6 along the opposite edge 17 of the windows 15; as a result of the shielding action of the layers 11 and 8, a central portion of the surface stripes 16 does not receive the N type dopant (FIGS. 6 and 6A).

Since implanting apparatus are commercially available which allow a fine control of the angle of tilting of the dopant ion beam in the range 0°–60°, the tolerance on the dimension along the X direction of the N+ source regions 6 substantially depends on the tolerance of the overall thickness of the oxide and insulated gate layers 11 and 8. It is known that the tolerance on the thickness of the grown or deposited layers is much narrower than the alignment tolerance between photolitographic masks. In fact, in some current photolitographic apparatus a tolerance of about 0.2 μm must be taken into account when two masks are to be aligned, thickness tolerances of 2–3% for layers of 500 Angstrom thickness are easily attainable. This technique allows reduction of the dimension along the X direction of the source regions 6 (from the current 1–3 μm to 0.2–0.25 μm), and of the non-implanted central portion of the surface stripes 16.

No thermal diffusion processes are performed after the implantation of the N type dopant.

A photoresist mask 19 (shown in FIG. 6A in dash-and-dot lines) prevents the dopant from being implanted into the regions of the uncovered surface stripes 16 near the short edges 18 of the windows 15; the N+ source regions 6 do not extend therefore for the whole length of the edges 17 of the windows 15.

Figure 7:
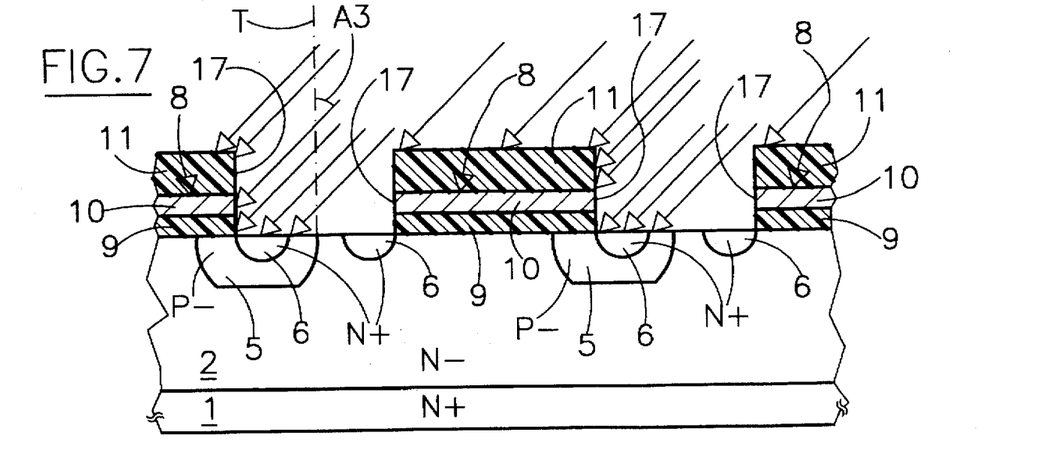

A P type dopant, such as boron, is then selectively implanted into the N− layer 2 along a direction which lies in said transversal plane, and which is tilted at an angle A3 with respect to the direction T; differently from the previous two steps, in this case the tilt angle is chosen, together with the implantation energy, to make the dopant penetrate under one edge 17 of the windows 15. The implantation dose can range from 1to $5\times10^{13}$cm$^2$, and the implantation energy can vary between 50 and 100 KeV. A suitable angle can be in the range 35°–60°, and is preferably 45°. In each uncovered surface stripe 16 a P− type stripe 5, extending in the Y direction, is thus formed around the N+ stripe 6, and extends under the insulated gate layer 8 to form a channel region of the elementary MOSFETs (FIG. 7). The implantation dose is generally low, and depends on the desired threshold voltage of the power MOSFET; the implantation energy must be higher than that used for the implantation of N+ source regions 6.

Figure 8:
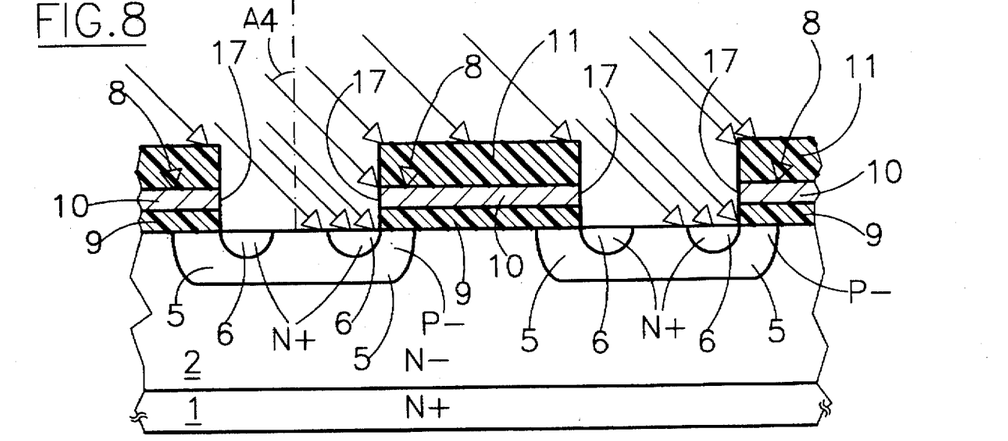
Figure 8A:
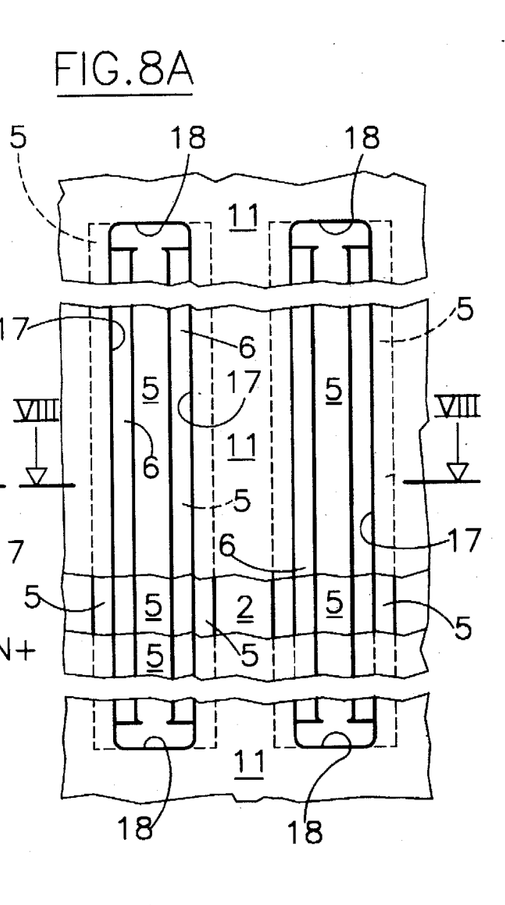

The previous step is repeated by tilting the dopant ion beam at an angle A4, substantially symmetrical to A3, to form in a same manner another P− type stripe 5 along the opposite edge of each window 15 (FIGS. 8 and 8A).

No thermal diffusion processes are performed after the implantation of the P type dopant.

Differently from the N+ source regions 6, the P− regions 5 extend for the whole length of the uncovered surface stripes 16. The absence of the N+ source regions 6 near the short edges 18 of the windows 15 prevents a channel short-circuit from occurring (since in fact no channel regions are provided under the short edges of the windows 15, if the source regions 6 extend for the whole length of the uncovered surface stripes 16 they would be in direct contact with the N− layer 2, thus causing a source-drain short-circuit).

Figure 9:
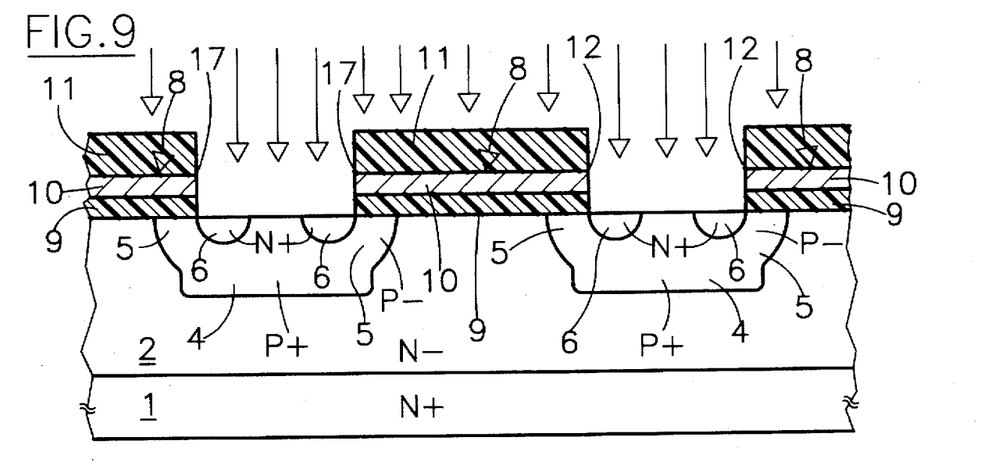

A high dose of a P type dopant is then implanted along the orthogonal direction T at a relatively high energy (100–200 KeV or greater), the oxide and insulated gate layers 11 and 8 acting as a mask so that after the implantation P+ deep body regions 4 are formed which are substantially self-aligned with the edges 17 and 18 of the windows 15; the P+ deep body regions 4 extend therefore under all the N+ source regions 6 which, according to the way in which they are formed, are also self-aligned with the elongated edges 17 of the windows 15 (FIG. 9). The implantation energy is chosen in such way as to locate the peak dopant concentration just under the source regions 6, and the dopant dose is chosen in such a way as the dopant concentration at the surface is of the order of $10^{18}$ atoms/cm$^3$.

A high temperature, low time duration thermal step is at this point performed to activate the dopants and to partially eliminate the defects caused by the implanted dopants. Such a step, performed in Rapid Thermal Annealers (RTAs), provides for submitting the chip to a temperature of about 1100° for only 30 seconds, and does not cause significant dopant redistribution; the doping profiles and dimensions of the various semiconductor regions are therefore not affected, i.e. they are determined by the implant doses and energies.

Figure 10:
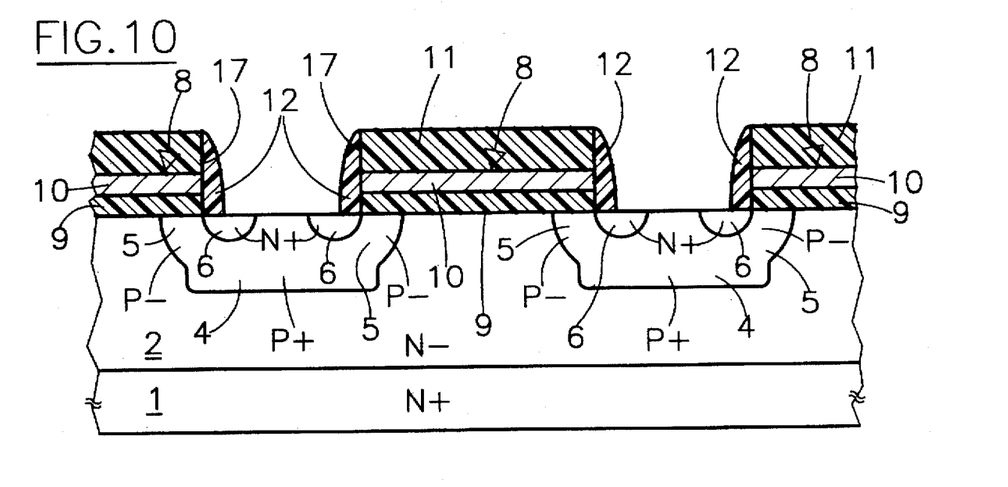

Oxide sidewall spacers 12 are then formed along the edges 17 and 18 of the windows 15 by means of a CVD deposition at low temperature (300°–400° C.) (FIG. 10).

A metal layer 13, as shown in FIG. 2 is then deposited over the oxide layer 11, to form a source electrode S of the power MOSFET; the oxide layer 11 and the sidewall spacers 12 electrically isolate the polysilicon gate layer 10 from the metal layer 13. A further metal layer 14 is formed on the bottom surface of the substrate 1 to form a drain electrode D, as shown in FIG. 2.

It appears that the described process involves only one mask (or two masks, considering the mask for the photoresist layer 19) with respect to the four masks required by the conventional processes. The P+ deep body regions 4, the P– regions 5 and the N+ source regions 6 are all self-aligned with the litographic mask used to define the windows 15 in the oxide layer 11 and in the insulated gate layer 8.

A distinctive feature of the process according to the invention with respect to the conventional processes is that it does not involve thermal steps with high thermal budgets. This has several advantages, which will be now discussed.

Firstly, the thickness of the gate oxide layer 9 can be reduced from the current 350–500 Angstroms to 100–200 Angstroms.

Secondly, the depth of the various semiconductor regions is determined by the implantation energy instead of the dopant diffusion process. In particular, the P+ deep body region 4 can be as shallow as 0.6 μm (instead of the conventional 3–4 μm). Since the breakdown voltage of the power MOSFET depends on the thickness of the portion of N– epitaxial layer 2 under the P+ deep body regions, the thickness of the epitaxial layer can be reduced to 2.4–3.4 μm.

Thirdly, the channel regions 5 are shorter than in conventionally-manufactured power device structures; in this way, not only the output resistance (Ron) of the power device is reduced, but further an increase in the integration scale of elementary functional units on a same chip is allowed.

Since the process according to the present invention does not involve thermal processes with high thermal budgets, the previously described sequence of steps could be altered without affecting the resulting structure; more precisely, the implantation steps leading to the formation of the source regions, of the channel regions and of the deep body regions can be interchanged. It would therefore be possible, for example, to initially form the deep body regions 4, then the channel regions 5, and finally the source regions 6.

The process according to the present invention applies as well to the fabrication of IGBTs, the only difference being the conductivity type of the substrate 1.

Having thus described at least one illustrative embodiment of the invention, various alterations, modifications, and improvements will readily occur to those skilled in the art. Such alterations, modifications, and improvements are intended to be within the spirit and scope of the invention. Accordingly, the foregoing description is by way of example only and is not intended as limiting. The invention is limited only as defined in the following claims and the equivalents thereto.

What is claimed is:

1. A process for manufacturing high-density MOS-technology power devices, comprising the steps of:

a) forming a conductive insulated gate layer on a surface of a lightly doped semiconductor material layer of a first conductivity type;

b) forming an insulating material layer over the insulated gate;

c) moving the insulating material layer and the underlying insulated gate layer to form a plurality of elongated windows each having two elongated edges and two short edges, delimiting respective uncovered surface stripes of the semiconductor material layer;

d) implanting a high dose of a first dopant of the first conductivity type along first and second directions which lie in a plane transverse to said elongated windows and orthogonal to the semiconductor material layer surface, the first and second directions substantially symmetrical to one another at a first prescribed angle with respect to a direction orthogonal to the semiconductor material layer surface, the first prescribed angle depending on an overall thickness of the insulated gate layer and of the insulating material layer to prevent the first dopant from being implanted in a central stripe of said uncovered surface stripes, to form first and second heavily doped elongated source regions of the first conductivity type which extend along said two elongated edges of each elongated window, respectively, and which are separated by said central stripe;

e) implanting a low dose of a second dopant of a second conductivity type along third and fourth directions which lie in said transverse plane, the third and fourth directions substantially symmetrical to one another at a second prescribed angle with respect to said orthogonal direction, to form third and fourth lightly doped elongated channel regions of the second conductivity type extending, respectively, under the two elongated edges of each elongated window; and f) implanting a high dose of a third dopant of the second conductivity type substantially along said orthogonal direction, the insulating material layer acting as a mask, to form heavily doped regions substantially aligned with the edges of each of the elongated windows.

2. The process according to claim 1, wherein the implantation of said first dopant is prevented in center regions of the short edges of said elongated windows.

3. The process according to claim 1, further comprising the steps of:

g) forming insulating material sidewalk spacers at the edges of said elongated windows; and h) forming a conductive material layer over the insulating material layer.

4. The process according to claim 1, wherein said first prescribed angle is in a range of 45°–60°.

5. The process according to claim 1, wherein said second prescribed angle is in a range of 35°–60°.

6. The process according to claim 1, wherein said third dopant is implanted at an energy sufficiently high so that a peak concentration of the third dopant is located under the source regions.

7. The process according to claim 6, wherein said third dopant is implanted at an energy of at least 100 KeV.

8. The process according to claim 1, wherein the step e) is performed before the step d).

9. The process according to claim 8, wherein the step f) is performed after the step e) and before the step d).

10. The process according to claim 1, wherein the step f) is performed before the step d).

11. The process according to claim 10, wherein the step e) is performed after the step f) and before the step d).

12. The process according to claim 1, wherein the step f) is performed before the step e).

13. The process according to claim 1, wherein said insulated gate layer is formed by growing a thin oxide layer over the surface of the semiconductor material layer, and covering the thin oxide layer with a further conductive material layer.

14. The process according to claim 1, wherein said semiconductor material layer is an epitaxial layer grown over a heavily doped semiconductor material substrate.

15. The process according to claim 14, wherein said semiconductor material substrate is doped of the first conductivity type, the power device being a power MOSFET.

16. The process according to claim 14, wherein said semiconductor material substrate is doped of the second conductivity type, the power device being an IGBT.

17. The process according to claim 1, wherein said first conductivity type is N type, and said second conductivity type is P type.

18. The process according to claim 1, wherein said first conductivity type is P type, and said second conductivity type is N type.

19. A process for manufacturing a high-density MOS-technology power device, the power device including a conductive insulated gate layer on a surface of a lightly doped semiconductor material layer of a first conductivity type, an insulating material layer over the insulated gate layer, and the insulating material layer and the underlying insulated gate layer forming an elongated window having two elongated edges and two short edges delimiting an uncovered surface stripe of the semiconductor material layer, the process comprising the steps of:

a) implanting a high dose of a first dopant of the first conductivity type along first and second directions which lie in a plane transverse to said elongated window and orthogonal to the semiconductor material layer surface, the first and second directions substantially symmetrical to one another at a first prescribed angle with respect to a direction orthogonal to the semiconductor material layer surface, the first prescribed angle depending on an overall thickness of the insulated gate layer and of the insulating material layer to prevent the tint dopant from being implanted in a central stripe of said uncovered surface stripe, to form first and second heavily doped elongated source regions of the first conductivity type which extend along said two elongated edges of the elongated window and which are separated by said central stripe;

b) implanting a low dose of a second dopant of a second conductivity type along third and fourth directions which lie in said transverse plane, the third and fourth directions substantially symmetrical to one another at a second prescribed angle with respect to said orthogonal direction, to form third and fourth lightly doped elongated channel regions of the second conductivity type extending, respectively, under the two elongated edges of the elongated window; and c) implanting a high dose of a third dopant of the second conductivity type substantially along said orthogonal direction, the insulating material layer acting as a mask, to form heavily doped regions substantially aligned with the edges of the elongated window.

20. The process as recited in claim 19, wherein the implanting of the first dopant of the first conductivity type is prevented in center regions of the short edges of the elongated window.

21. The process as recited in claim 19, further comprising the step of forming an insulating material sidewall spacer at an edge of the elongated window.

22. The process as recited in claim 19, wherein the first prescribed angle is in a range of 45°–60°.

23. The process as recited in claim 19, wherein the second prescribed angle is in a range of 35°–60°.

24. The process as recited in claim 19, wherein the third dopant is implanted with an implantation energy level sufficient such that a peak concentration of the third dopant is located under the first and second source regions.

* * * * *

UNITED STATES PATENT AND TRADEMARK OFFICE
CERTIFICATE OF CORRECTION

PATENT NO. : 5,670,392

DATED : September 23, 1997

INVENTOR(S) : Giuseppe Ferla, Ferruccio Frisina

It is certified that error appears in the above-identified patent and that said Letters Patent is hereby corrected as shown below:

Column 8
In claim 1, line 17, after "gate" insert --layer--;

line 18, change "moving" to --removing--;

In claim 3, line 60, change "sidewalk" to --sidewall--; and

In claim 19, column 10, line 11, change "tint" to --first--.

Signed and Sealed this

Twenty-fifth Day of November, 1997

Attest:

BRUCE LEHMAN

Attesting Officer

Commissioner of Patents and Trademarks